(12) United States Patent
Friedrichs et al.

(10) Patent No.: US 6,936,850 B2
(45) Date of Patent: Aug. 30, 2005

(54) SEMICONDUCTOR DEVICE MADE FROM SILICON CARBIDE WITH A SCHOTTKY CONTACT AND AN OHMIC CONTACT MADE FROM A NICKEL-ALUMINUM MATERIAL

(75) Inventors: Peter Friedrichs, Nürnberg (DE); Dethard Peters, Höchstadt (DE); Reinhold Schoerner, Grossenseebach (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 119 days.

(21) Appl. No.: 10/103,518

(22) Filed: Mar. 22, 2002

(65) Prior Publication Data

US 2002/0125482 A1 Sep. 12, 2002

Related U.S. Application Data

(63) Continuation of application No. PCT/DE00/03147, filed on Sep. 11, 2000.

(30) Foreign Application Priority Data

Sep. 22, 1999 (DE) .......................................... 199 45 453

(51) Int. Cl.[7] .......................................... H01L 31/0312
(52) U.S. Cl. .......................... 257/77; 257/109; 257/421
(58) Field of Search .......................... 257/77, 109, 421

(56) References Cited

U.S. PATENT DOCUMENTS

| | | | |
|---|---|---|---|
| 4,310,568 A | | 1/1982 | Howard et al. |
| 4,641,174 A | | 2/1987 | Baliga |
| 4,982,260 A | * | 1/1991 | Chang et al. ............... 257/656 |
| 5,270,252 A | | 12/1993 | Papanicolaou |
| 5,471,072 A | | 11/1995 | Papanicolaou |
| 5,895,260 A | | 4/1999 | Bhatnagar et al. |
| 5,929,523 A | | 7/1999 | Parsons |
| 6,313,482 B1 | * | 11/2001 | Baliga ......................... 257/77 |
| 6,373,076 B1 | * | 4/2002 | Alok et al. ................... 357/76 |

FOREIGN PATENT DOCUMENTS

| | | | |
|---|---|---|---|
| DE | 1 962 814 | | 6/1971 |
| DE | 44 01 858 A1 | | 7/1995 |
| DE | 197 23 176 C1 | | 8/1998 |
| EP | 0 380 340 A2 | | 8/1990 |
| EP | 0 380 340 A3 | | 8/1990 |
| JP | 06-061475 A | * | 3/1994 .................. 257/77 |
| WO | 96/03774 | | 2/1996 |

OTHER PUBLICATIONS

Translation of 06–061475 from the Patent Abstracts of Japan, Pub. Date Apr. 3, 1994.*
"Status of Silicon Carbide (SiC) as a Wide–Bandgap Semiconductor for High–Temperature Applications: A Review" (Casady et al.), Solid–State Electronics, vol. 39, No. 11, pp. 1409–1422.
"A critical Review of Ohmic and Rectifying Contacts for Silicon Carbide" (Porter et al.), Materials Science and Engineering B.34, 1995, pp. 83–105.

(Continued)

*Primary Examiner*—Howard Weiss

(57) ABSTRACT

The semiconductor device includes a first semiconductor region made from n-conducting SiC and a second semiconductor region made from p-conducting SiC. A Schottky contact layer electrically contacts the first semiconductor region, and an ohmic p-contact layer electrically contacts the second semiconductor region. Both contact layers consist of a nickel-aluminum material. This allows both contact layers to be annealed together without adversely effecting the Schottky contact behavior.

7 Claims, 1 Drawing Sheet

OTHER PUBLICATIONS

"High Voltage Ni/4H–SiC Schottky Rectifiers" (Chilukuri et al.), ISPSD 99, Proceedings, May 1999, pp. 161–164.

"A Dual–Metal–Trench Schottky Pinch–Rectifier in 4H–SiC" (Schoen et al.), IEEE Electron Device Letters, vol. 19, No. 4, Apr. 1998, pp. 97–99.

"The Guard–Ring Termination for the High–Voltage SiC Schottky Barrier Diodes" (Ueno et al.), IEEE Electron Device Letters, vol. 16, No. 7, Jul. 1995.

Ohmic Contacts to p–Type SiC with Improved Thermal Stability (Liu et al.), Materials Science Forum, vols. 264–68, pp. 791–794.

* cited by examiner

SEMICONDUCTOR DEVICE MADE FROM SILICON CARBIDE WITH A SCHOTTKY CONTACT AND AN OHMIC CONTACT MADE FROM A NICKEL-ALUMINUM MATERIAL

CROSS-REFERENCE TO RELATED APPLICATION

This is a continuation of copending International Application PCT/DE00/03147, filed Sep. 11, 2000, which designated the United States.

BACKGROUND OF THE INVENTION

Field of the Invention

The invention relates to a semiconductor device made from silicon carbide (SiC) having a Schottky contact and an ohmic contact on SiC semiconductor regions with opposite conductivity types. The invention also relates to a method of producing a semiconductor device of this type.

U.S. Pat. No. 4,641,174 discloses a semiconductor device having a Schottky contact and an ohmic contact. The document describes what is known as a pinch rectifier diode, in which a plurality of Schottky diodes and a plurality of p-n diodes are arranged alternately in a single semiconductor substrate and are connected in parallel. This arrangement is distinguished by a good barrier behavior, since the space charge zones of the p-n diodes restrict the current-carrying regions of the Schottky diodes and thus improve the blocking capacity of the Schottky diodes. Since the Schottky diodes and the p-n diodes are arranged alternately on the same surface, a contact that on one hand has an ohmic behavior on a strongly p-conducting semiconductor region and on the other hand has a Schottky behavior on a weakly n-conducting semiconductor region is required. For semiconductor regions that are made from silicon, aluminum is mentioned as a contact material that is suitable in this respect. On the other hand, there is no indication of a contact material that is suitable for silicon carbide.

U.S. Pat. No. 5,895,260 describes a process for producing a Schottky diode in n-conducting SiC. A first surface of the SiC semiconductor region is initially covered with a dielectric film. Then, an ohmic back-surface contact, in the form of a nickel (Ni) layer, is applied to a second surface of the SiC semiconductor region, and is annealed at an annealing temperature of 950° C. A Schottky metallization is applied within a contact window that is subsequently uncovered and extends as far as the first surface. Ti/Al or Ni/Al, which is not described in further detail, is used as metal for the Schottky contact. Since the semiconductor device described is not a pinch diode, but rather a simple Schottky diode, the document also does not disclose an ohmic contact on a p-conducting SiC semiconductor region.

Furthermore, U.S. Pat. Nos. 5,270,252 and 5,471,072 each disclose a Schottky diode produced from n-conducting β-SiC. The base metal used for the Schottky contact is, in each case, platinum (Pt). An ohmic contact is formed by a titanium (Ti)/gold (Au) layer structure and is annealed at approximately 750° C. prior to the application of the Schottky contact. In this case, the Schottky contact and the ohmic contact, in each case make contact with n-conducting Sic .

Published European Patent Application EP 0 380 340 A2 discloses a further Schottky diode that is produced from n-conducting α-SiC and in which platinum (Pt) is once again used as an essential constituent of the Schottky metallization. A nickel (Ni) layer is applied to the back surface as ohmic metallization and is annealed at approximately 1000° C. prior to the application of the Schottky contact. In this case too, the Schottky contact and the ohmic contact, in each case, make contact with n-conducting SiC.

Moreover, U.S. patent application Ser. No. 5,929,523 discloses a Schottky contact including osmium (Os) on n-conducting silicon carbide. Prior to the application of the Schottky contact, the ohmic back-surface contact is produced. The Schottky contact requires a special production process including a process step in which, first of all, a few monolayers of silicon are sputtered onto the surface. The Schottky contact produced in this way is then highly thermally stable. Osmium is one of the rare earth elements. It is an element that is difficult to procure and is also expensive.

Furthermore, the technical article "The Guard-Ring Termination for the High-Voltage SiC Schottky Barrier Diodes" in IEEE Electron Device Letters, Vol. 16, No. 7, July 1995 discloses a semiconductor device having a Schottky contact on an n-conducting SiC drift region and having a guard ring made from p-conducting SiC. The n-conducting drift region and the p-conducting guard ring are provided with a common contact layer made from Al/Ti. In this way, ohmic contact will be made with the guard ring. Since the guard ring, as is customary, is used only to guide electrical fields in the barrier device, and in the injection of minority charge carriers in the forward direction, switching of the p-n diode formed between the guard ring and the drift region, should be expressly prevented, however, there is no need for a high-quality ohmic contact with the guard ring, and such contact is also not reproducibly disclosed. This is because it can be inferred from the low p-doping of the guard ring that contact with the guard ring does not exhibit any real ohmic behavior.

The summary article on SiC by J. B. Casady and R. W. Johnson in "Solid-State Electronics", Vol. 39, No. 10, pp. 1409–1422, 1996, includes a section dealing with the Schottky contacting of SiC. Accordingly, hitherto nickel (Ni), nickel/chromium (NiCr), gold (Au), platinum (Pt), titanium (Ti), magnesium (Mg), cobalt (Co), aluminum (Al), hafnium (Hf) and palladium (Pd) have been used for a Schottky contact on SiC. The level of the Schottky barrier that can be achieved is dependent not only on the metal used, but also on the surface quality of the silicon carbide, on the deposition process, on the SiC polytype, on the conductivity (n-conducting or p-conducting) and on the orientation of the SiC surface (Si side or C side). However, there is no indication of an additional ohmic contact that is arranged immediately adjacent to the Schottky contact, on a SiC semiconductor region that has an opposite conductivity type to that of the SiC semiconductor region with which contact is made by the Schottky contact.

Issued German Patent DE 197 23 176 C1 describes a pinch rectifier diode made from SiC, which includes a first semiconductor region made from n-conducting silicon carbide and a second semiconductor region made from p-conducting silicon carbide, as well as a Schottky contact layer and an ohmic p-contact layer that make electrical contact with the first and second semiconductor regions, respectively. However, the materials disclosed are unable to produce contact layers that have both a good Schottky contact behavior and a good ohmic contact behavior.

SUMMARY OF THE INVENTION

It is accordingly an object of the invention to provide semiconductor device having a good Schottky contact on an n-conducting SiC semiconductor region and having a good ohmic p-contact on a p-conducting SiC semiconductor region.

It is also an object of the invention to configure the Schottky contact and the ohmic p-contact lying directly adjacent to one another.

Moreover, it is also an object of the invention to provide a simple and inexpensive process for producing a semiconductor device that has a good Schottky contact on an n-conducting SiC semiconductor region and a good ohmic p-contact on a p-conducting SiC semiconductor region.

With the foregoing and other objects in view there is provided, in accordance with the invention, a semiconductor device made from silicon carbide, that includes: a first semiconductor region including n-conducting silicon carbide and a second semiconductor region including p-conducting silicon carbide; a Schottky contact layer electrically contacting the first semiconductor region; and an ohmic p-contact layer electrically contacting the second semiconductor region. The Schottky contact layer and the ohmic p-contact layer consisting of a material having at least a first component and a second component. The first component is nickel, and the second component is aluminum.

In accordance with an added feature of the invention, the first semiconductor region has a dopant concentration of at most $10^{17}$ cm$^{-3}$.

In accordance with an additional feature of the invention, the second semiconductor region has a dopant concentration of between $10^{17}$ cm$^{-3}$ and $10^{20}$ cm$^{-3}$.

In accordance with another feature of the invention, the material contains at least 20% by volume of the aluminum.

In accordance with a further feature of the invention, the material contains at most 80% by volume of the aluminum.

In accordance with a further added feature of the invention, the Schottky contact layer and the ohmic p-contact layer form a cohesive common contact layer.

In accordance with a further additional feature of the invention, the Schottky contact layer and the ohmic p-contact layer are designed as contact layers that are annealed at a temperature of at least 600° C.

With the foregoing and other objects in view there is also provided, in accordance with the invention, a process for producing a semiconductor device made from silicon carbide that has a Schottky contact and an ohmic p-contact. The process includes steps of: forming a Schottky contact layer on a first semiconductor region made from n-conducting silicon carbide; forming an ohmic p-contact layer on a second semiconductor region made from p-conducting silicon carbide; forming the Schottky contact layer and the ohmic p-contact layer from a material having at least a first material component and a second material component; providing nickel as the first material component; and providing aluminum as the second material component.

In accordance with an added mode of the invention, the first semiconductor region is provided with a dopant concentration of at most $10^{17}$ cm$^{-3}$.

In accordance with an additional mode of the invention, the second semiconductor region is provided with a dopant concentration of between $10^{17}$ cm$^{-3}$ and $10^{20}$ cm$^{-3}$.

In accordance with another mode of the invention, the aluminum is provided as at least 20% by volume of the material.

In accordance with a further mode of the invention, the aluminum is provided as at most 80% by volume of the material.

In accordance with a further added mode of the invention, the Schottky contact layer is formed on the first semiconductor region simultaneously when and the ohmic p-contact layer is formed on the second semiconductor region.

In accordance with a further additional mode of the invention, the material is formed by simultaneously vaporizing or atomizing material from two separate sources of the first material component and the second material component.

In accordance with yet an added mode of the invention, the process includes steps of: defining the material as a first material; preparing a source material; and subsequently forming the first material by atomizing the source material.

In accordance with yet an additional mode of the invention, the process includes subjecting the Schottky contact layer, the first semiconductor region, the ohmic p-contact layer, and the second semiconductor region to an annealing step. The annealing step is performed at an annealing temperature of at least 600° C., and preferable at an annealing temperature of at least 10000° C.

In accordance with yet another mode of the invention, the annealing temperature is kept constant for a period of at most 2 hours.

In accordance with yet a further mode of the invention, the annealing temperature is kept constant for a period of at most 2 minutes.

The invention is based on the discovery that, by selecting the particularly expedient nickel-aluminum material, a semiconductor device having an ohmic p-contact on p-conducting SiC and having a Schottky contact on n-conducting SiC can be produced in a considerably simplified manner. This is particularly true if the two contacts lie directly adjacent to one another. Since, moreover, the nickel-aluminum material leads to very good contact properties, a semiconductor device that is produced using this contact material is particularly advantageous. The contact material may, in this case, be in the form of a mixture, a blend, an alloy, or a compound of at least the nickel component and the aluminum component.

Hitherto, the ohmic p-contact and the Schottky contact have been produced in separate working steps and in particular also from different contact materials. Since the heat-treatment process that is carried out at an annealing temperature of at least 900° C. for contact annealing the ohmic p-contact, in practice, always impairs the electrical properties of a Schottky contact that is also subjected to the heat treatment, the Schottky contact is currently usually applied only after the ohmic contact annealing.

However, this successive production of the ohmic p-contact and of the Schottky contact entails additional manufacturing outlay that is not insignificant. Particularly in the case of adjacent contacts, various masking steps are required so that the two contact layers can be applied after and next to one another. If appropriate, the surface to which the Schottky contact will be applied is also subjected to an additional preliminary treatment.

Using the advantageous nickel-aluminum material obviates the need for the process steps described, so that the production process is considerably shortened. This is because the Schottky contact layer can be annealed together with the ohmic p-contact layer without any significant degradation of the Schottky contact behavior. This favorable property is achieved only if the material contains both nickel and aluminum. Neither pure nickel nor pure aluminum has this benefit. Since the surface for the Schottky contact is directly covered with the final Schottky contact layer, there is also no need for an additional preliminary treatment. This benefits the process economics and improves the quality of the Schottky contact.

Even when the same material is being applied to the first and second semiconductor regions, it is possible if appropriate, depending on the SiC doping selected and on the composition of the material used, for a boundary region with slightly differing material compositions to be established between the two semiconductor regions and the two contact layers. This slight deviation originates from different exchange processes between the applied material and the first or second semiconductor region.

For example, the material applied with the aluminum contains a material component that acts as an acceptor in silicon carbide. The aluminum will therefore migrate to a certain extent into the first or second semiconductor region, where it will be bonded to appropriate lattice sites as an acceptor. This mixing process is decisively affected by the original doping of the first or second semiconductor region, and therefore proceeds differently in the respective boundary region. Consequently, the aluminum content in the respective boundary regions changes in different, if only very minor extents.

The silicide-forming component nickel also causes a certain shift in the material composition in the respective boundary regions. In this case, silicon that originates from the first and second semiconductor regions becomes mixed with the nickel in the two contact layers. As a result, a nickel silicide is then formed in the two boundary regions. This process too is decisively influenced by the level of doping and the conductivity type, and consequently this effect can likewise lead to a slightly differing material composition in the boundary regions.

In those regions of the two contact layers that are located away from the interfaces, the interfacial effects described have no effect, so that the material remains in the composition in which it was originally applied, and therefore in these regions, is the same as the respective contact layer.

In the inventive teaching, all minor differences in the material composition of the two contact layers, such as those that are based on the interfacial effects described or the like, are not considered crucial and are subsumed under the terms "at least approximately identical material composition" and "practically homogenous".

Moreover, differences in the material composition that are attributable to standard, in some cases, different impurities in starting substances are likewise not considered to be crucial in the present context.

To form a good Schottky contact, it is advantageous if the n conducting first semiconductor region is only weakly doped. Therefore, the dopant concentration is expediently at most $10^{17}$ cm$^{-3}$, and preferably, at most $3 \cdot 10^{16}$ cm$^{-3}$. The dopant concentration is determined decisively by the breakdown voltage of the semiconductor device. For example, for a reverse voltage of up to 1200 V, a dopant concentration of $1.2 \cdot 10^{16}$ cm$^{-3}$ is selected, and for a reverse voltage of up to 3000 V, a dopant concentration of $3.6 \cdot 10^{15}$ cm$^{-3}$ is selected.

By contrast, for a good ohmic p-contact, it is expedient if the p-conducting second semiconductor region has a sufficiently high dopant concentration, at least in the boundary region with the ohmic p-contact layer. It is preferable for the dopant concentration to be between $10^{17}$ cm$^{-3}$ and $10^{20}$ cm$^{-3}$. A particularly good ohmic p-contact results if the dopant concentration is at least $10^{19}$ cm$^{-3}$. The dopant concentration can be produced without problems, for example by adding suitable amounts of dopant during epitaxial growth or retrospectively by using ion implantation.

In a preferred embodiment, the material contains at least 20% by volume of aluminum. A volumetric aluminum content of at most 80% has proven to be an appropriate upper limit. A volumetric aluminum content of between 40% and 50% is particularly advantageous. A volumetric content can also be determined if the material is in the form of an (intermetallic) compound. In this case, the atomic radii of the relevant nickel and aluminum atoms and their respective frequency, based on a unit cell, are of decisive importance for such a determination. If appropriate, the reduced atom spacing in an intermetallic compound can also be taken into account. Although it is more efficient to provide an identical material composition for both contact layers when producing the ohmic p-contact and the Schottky contact, in principle, it is also possible to differ from this arrangement. For example, an aluminum content of 50% in the Schottky contact layer and an aluminum content of 20% in the ohmic p-contact layer is possible.

Moreover, it is expedient if the material consists only of nickel and aluminum. Then, apart from inevitable impurities and the dopant atoms, a practically purely quaternary material system including the individual components silicon and carbon, which originate from the SiC semiconductor regions, and nickel and aluminum, which originate from the material for the contact layers, is present in the boundary regions. This virtually completely rules out the possibility of the contact behavior being impaired by the additional presence of foreign atoms in the boundary regions, which could influence the exchange processes in the quaternary material system.

In a preferred variant embodiment, the two contact layers are formed as a continuous common contact layer. In principle, however, an embodiment in which the Schottky layer and the p-contact layer are separate from one another is also possible.

Moreover, a configuration in which the two contact layers have been subjected to annealing at a temperature of at least 600° C. is favorable. The contact layers that have been annealed in this way then provide a particularly good Schottky contact with the first semiconductor region and a particularly good ohmic contact with the second semiconductor region.

Other forms of the process relate to the application of the material to the first and second semiconductor regions.

An embodiment in which the two contact layers are produced simultaneously is particularly advantageous. This considerably reduces the number of process steps required compared to successive application. In this way, shorter production cycles can be achieved. A masking step that may otherwise be required can then also be dispensed with, as can separate annealing of the two contact layers. It is advantageously possible for the two contact layers in fact to be annealed at the same temperature without greatly impairing the quality of the Schottky contact.

This is also of benefit in the variant embodiment in which the two contact layers are designed as a continuous common contact layer. Because of the common processing, in particular, the common contact annealing of the Schottky contact and of the ohmic p-contact, which is possible as a result of the specific material properties of the contact material, this variant embodiment can be produced particularly easily.

Moreover, to obtain both a good Schottky contact behavior on the n-conducting SiC and a good ohmic contact behavior on the p-conducting SiC, it is expedient if the contact layers are present with a practically homogenous material composition, i.e. with a material composition which is at least approximately identical within the respective contact layer, on the corresponding semiconductor regions. This is achieved, in particular, not by applying the material to the semiconductor regions in the form of a layer structure, but rather directly, by applying the material in the final mixing ratio of the two main constituents nickel and aluminum. If the material is composed of a plurality of material components, a homogenous application of material of this nature results, in each case, in all of the material components being present directly at the interface with the two semiconductor regions and being able to interact with the silicon carbide of the two semiconductor regions. By contrast, in a layer structure, first of all, intimate mixing of the nickel and aluminum layers that are applied separately, for example, with a thickness of the order of magnitude of a few nanometers, is required. This intimate mixing (=homogenization) takes place in particular at the start of a heat-treatment process that is carried out after the application of the material. The heat-treatment process is used for contact annealing. It is now of crucial importance for the quality of both the ohmic p-contact and the Schottky contact if, in the heat-treatment process, all of the relevant material components are present directly at the interface with the semiconductor regions right from the outset.

In a further refinement of the process, the material that is applied to the two semiconductor regions is removed from at least two separate sources. In this case, the sources include in each case, at least one material component, in particular aluminum or nickel. The removal is effected by simultaneous vaporization or atomization (sputtering). The two contact layers are then formed by deposition of the two material components on the first and second semiconductor regions. The material for the two contact layers is formed either still in the vapor phase from the individual material components or in the course of the deposition operation. The process parameters, such as for example, a suitable plasma jet or electron beam power, can be used to ensure that a certain intended mixing ratio is maintained.

By contrast, an alternative form provides first for a source material to be produced from the first and second material components, and for this source then to be atomized in a second process step. The particles that are released from the material, as in the embodiment described above, form the two contact layers on the n-conducting and p-conducting silicon carbide.

In an advantageous variant embodiment, the semiconductor device, after the two contact layers have been applied, is subjected to a heat treatment process for contact annealing. It is preferable for the semiconductor device to be heated to an annealing temperature of at least 600° C., in particular of approximately 1000° C., and then to be held at approximately this annealing temperature for up to 2 hours, in particular for 2 minutes. The annealing may also simply include a heat-up phase and an immediately following cooling phase, without a holding time at the annealing temperature between these two phases.

When using a different material from the nickel-aluminum material used here, the high annealing temperature above approximately 500° C. would deteriorate and even complete destroy the Schottky contact. Therefore, a Schottky contact that is currently customary is only annealed at a temperature of at most 400° C. However, at such a low temperature the ohmic p-contact is not yet sufficiently annealed. Therefore, simultaneous annealing of the two contacts is impossible.

In the case of the nickel-aluminum material, after performing the simultaneous annealing that has been described, in contrast with the prior art, a good Schottky is formed on the n-conducting SiC and a good ohmic p-contact is formed on the p-conducting SiC, and both are able to withstand high temperatures.

The two semiconductor regions with which contact is to be made may consist of polytypes other than α-SiC. In particular, it is possible to use 6H, 4H or 15R SiC. The 4H polytype is particularly advantageous. However, α-SiC polytypes other than those mentioned are also possible. Both the Si side and the C side of the α-SiC single crystal can be employed as the contact surface for the contact layers. However, the Si side is particularly advantageous. A standard misalignment with a misalignment angle of, for example, up to 10° is included in this orientation data.

The semiconductor device is particularly suitable for use as a to rapid high-voltage diode. In particular, the semiconductor device can be used to implement a reverse voltage of $\geq 3$ kV. This is due to the high Schottky barrier of more than 1.5 eV that can be achieved with the special nickel-aluminum material employed. The fact that the Schottky barrier, in the blocking situation or reverse bias, can be exposed to a higher field strength than a semiconductor device that uses a different contact material for the Schottky contact means that the semiconductor device is particularly suitable for being used at a high reverse voltage.

Other features which are considered as characteristic for the invention are set forth in the appended claims.

Although the invention is illustrated and described herein as embodied in a semiconductor device made from silicon carbide having a Schottky contact and an ohmic contact that are made from a nickel-aluminum material, and a process for producing the semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
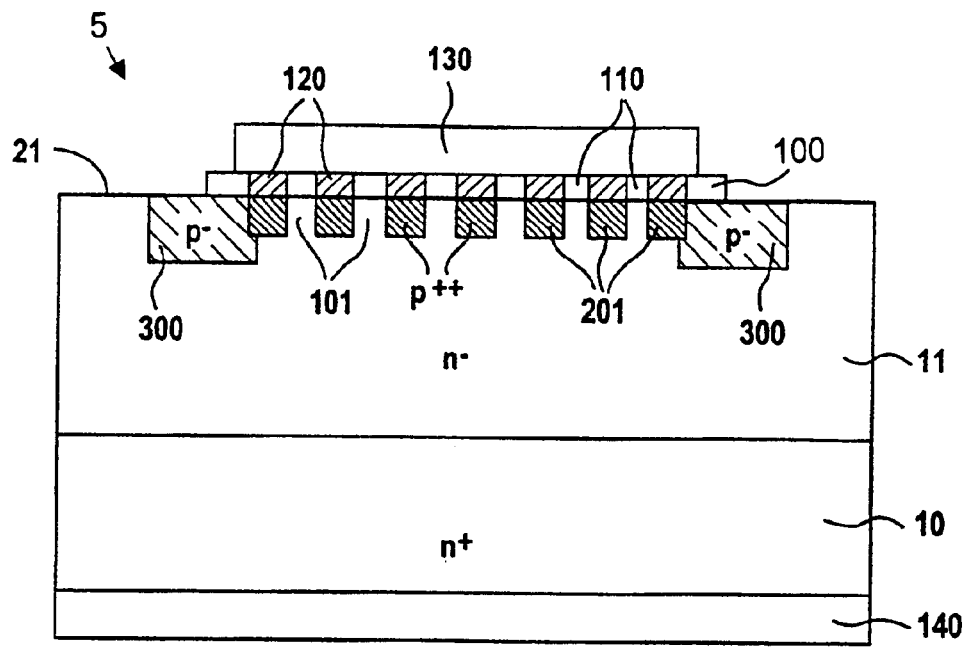
FIG. 1 shows a first SiC semiconductor device with a Schottky contact and an ohmic p-contact.
Figure 2:
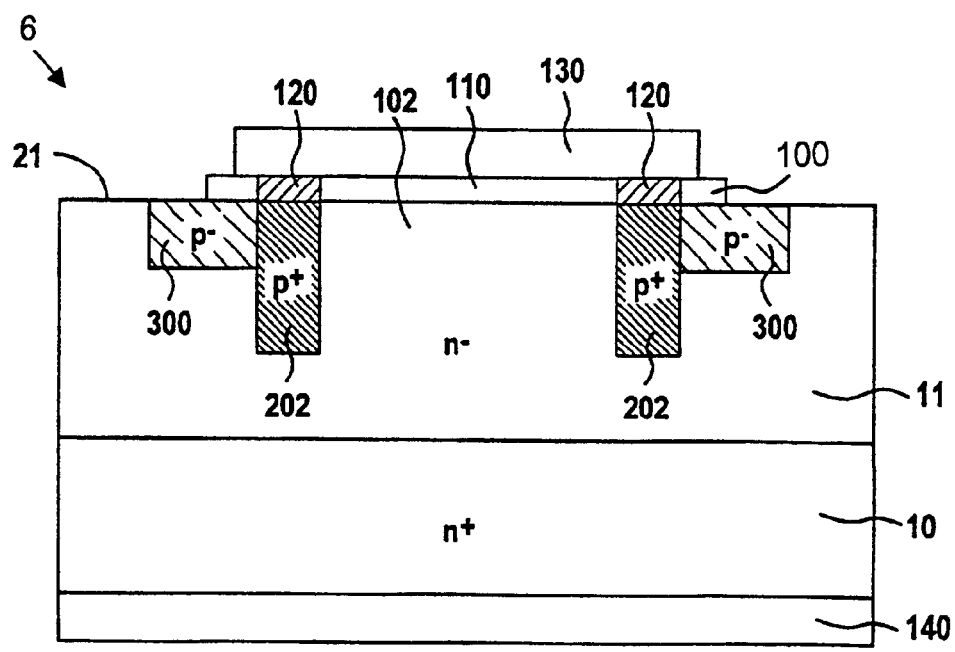
FIG. 2 shows a second SiC semiconductor device with a Schottky contact and an ohmic p-contact.

In FIGS. 1 and 2, corresponding parts have been provided with the same reference numerals. Referring now to the figures of the drawing in detail and first, particularly, to FIG. 1 thereof, there is shown a semiconductor device produced in the form of a pinch diode 5 formed from 4H-SiC. The base is formed by a strongly n-conducting 4H-SiC substrate 10 with a dopant concentration of $10^{19}$ cm$^{-3}$, to which a weakly n-conducting 4H-SiC epitaxially grown layer 11 with a dopant concentration of $10^{16}$ cm$^{-3}$ is applied. The dopant used for the n-conducting SiC is in each case nitrogen. The low doping of the epitaxially grown layer 11 ensures a high blocking capacity, and the high doping of the substrate 10 ensures a low forward resistance of the pinch diode 5. The pinch diode 5 shown is designed for a reverse voltage of up to 1200 V.

On a surface 21 of the epitaxially grown layer 11 which is remote from the substrate 10, a Schottky contact layer 110 contacts first semiconductor regions 101 that are formed by the epitaxially grown layer 11. Moreover, a plurality of strongly p-doped second semiconductor regions 201, which alternate with the first semiconductor regions 101, are arranged on the surface 21. Aluminum is used as acceptor material for the second semiconductor regions 201, which have a dopant concentration of $10^{19}$ cm$^{-3}$. An ohmic p-contact layer 120 contacts each of the second semiconductor regions 201.

The structure shown in FIG. 1, with alternately arranged weakly doped n-conducting first semiconductor regions 101 and strongly doped p-conducting second semiconductor regions 202 is typical of a pinch diode. When reverse biased, the p-conducting second semiconductor regions 202 are responsible for completely pinching-off the first semiconductor regions 101 that are provided for conducting current in the forward-transmission mode, with the result that the breakdown voltage or blocking capacity is increased.

Therefore, first and second semiconductor regions 101 and 201 of different conductivity types, with which electrical contact is made via a Schottky contact and via an ohmic p-contact, respectively, are arranged on the surface 21 of the epitaxially grown layer 11, directly adjacent to one another. Since they are directly adjacent to one another, the contact layers 110 and 120 are formed as a continuous common contact layer 100. The common contact layer 100 consists of a material that is composed of aluminum and nickel, in each case forming 50% by volume. This is because it has been found that this special contact material forms both a good Schottky contact on n-conducting SiC and a good ohmic p-contact on the p-conducting SiC.

The contact layers 110 and 120 have been applied to the surface 21 together in a single production step and have then been annealed together at a temperature of approximately 1000° C. Because of the special materials properties of the nickel-aluminum material, this annealing does not cause any deterioration in the Schottky contact behavior, unlike with other possible contact materials. Consequently, the pinch diode 5 shown in FIG. 1 can be produced particularly easily and inexpensively. In particular, there is no need for any separate protective or cleaning measures for the surface 21 in the region of the Schottky contacts.

In an edge region, the first and second semiconductor regions 101 and 201, respectively, are additionally surrounded by a weakly doped third semiconductor region 300. This third semiconductor region 300 is used as an edge termination and in particular avoids the formation of an excessively great electrical field in the region of the two semiconductor regions 101 and 201. An edge termination of this type is disclosed in International Publication WO 96/03774.

The contact layers 110 and 120 have a typical thickness of approximately 200 nm. An additional contact-reinforcing layer 130 of aluminum is arranged on the surface of the contact layers 110 and 120 that is remote from the epitaxially grown layer 11. A back-surface contact 140 made from nickel is provided on the side of the substrate 10 that is remote from the epitaxially grown layer 11. The nickel metallization that has been applied for the back-surface contact 140 was annealed together with the contact layers 110 and 120. In this way, an ohmic back-surface contact is additionally achieved using a single annealing step. As an alternative to the nickel, it is also possible for a nickel-iron (NiFe) alloy to be used for the back-surface contact 140.

FIG. 2 shows an example of another semiconductor device, specifically, a Schottky diode 6 that is resistant to surge currents. Unlike the pinch diode 5, the Schottky diode 6 which is resistant to surge currents does not include any structure in which semiconductor regions of opposite conductivity types alternate at the surface 21. Instead, a first semiconductor region 102, which is formed by the epitaxially grown layer 11 and is once again weakly n-conducting, is surrounded by a strongly p-doped second semiconductor region 202. This assumes a rotationally symmetrical structure of the Schottky diode 6 shown in FIG. 2.

Unlike the pinch diode 5, the Schottky diode 6 does not increase the blocking capacity by constricting current-carrying semiconductor regions, but rather increases the resistance to surge currents. For this purpose, a p-n diode, which is formed by the second semiconductor region 202 and the substrate 10, absorbs part of the surge current, which would otherwise flow entirely through the Schottky contact and could overload the latter. The special dimensioning means that this p-n diode switches only in the event of an overload, i.e. when a high current surge is present, whereas in normal forward-transmission mode it remains unenergized, so that all the current, in this normal operating state, flows via the Schottky contact.

The method of operation of the Schottky diode 6 described now requires a Schottky contact with respect to the first semiconductor region 102 and an ohmic p-contact with respect to the second semiconductor region 202. Once again, the two contacts lie directly adjacent to one another. Therefore, as in the exemplary embodiment shown in FIG. 1, a nickel-aluminum material is used as contact material for the Schottky contact layer 110 and the ohmic p-contact layer 120. This once again results in a continuous common contact layer 100. In this exemplary embodiment, the aluminum content is 40%, and accordingly the nickel content is 60%.

We claim:

1. A semiconductor device made from silicon carbide, comprising:
   a first semiconductor region including n-conducting silicon carbide and a second semiconductor region including p-conducting silicon carbide;
   a Schottky contact layer electrically contacting said first semiconductor region;
   an ohmic p-contact layer electrically contacting said second semiconductor region;
   said Schottky contact layer and said ohmic p-contact layer consisting of a material having at least a first component and a second component;
   said first component being nickel (Ni);
   said second component being aluminum (Al);
   said first and second components forming a substantially homogenous material composition; and
   said Schottky contact layer and said ohmic p-contact layer forming a cohesive common contact layer on both first and second semiconductor regions, said cohesive contact layer having said homogenous material composition of said first and second components.

2. The semiconductor device according to claim 1, wherein: said first semiconductor region has a dopant concentration of at most $10^{17}$ cm$^{-3}$.

3. The semiconductor device according to claim 2, wherein: said second semiconductor region has a dopant concentration of between $10^{17}$ cm$^{-3}$ and $10^{20}$ cm$^{-3}$.

4. The semiconductor device according to claim 1, wherein: said second semiconductor region has a dopant concentration of between $10^{17}$ cm$^{-3}$ and $10^{20}$ cm$^{-3}$.

5. The semiconductor device according to claim 1, wherein: said material contains at least 20% by volume of said aluminum.

6. The semiconductor device according to claim 1, wherein: said material contains at most 80% by volume of said aluminum.

7. The semiconductor device according to claim 1, wherein: said Schottky contact layer and said ohmic p-contact layer are configured as contact layers that are annealed at a temperature of at least 600° C., for providing Schottky contact with said first semiconductor region and ohmic contact with said second semiconductor region, respectively.

* * * * *